United States Patent [19]
Giorgio

[11] Patent Number: 5,761,085
[45] Date of Patent: Jun. 2, 1998

[54] METHOD FOR MONITORING ENVIRONMENTAL PARAMETERS AT NETWORK SITES

[75] Inventor: Paul J. Giorgio, Providence, R.I.

[73] Assignee: The United States of America as represented by the Secretary of the Navy, Washington, D.C.

[21] Appl. No.: 759,360

[22] Filed: Nov. 12, 1996

[51] Int. Cl.$^6$ .............................. G05B 15/02; H05K 7/20; B60H 1/00

[52] U.S. Cl. ........................ 364/505; 364/506; 364/481; 364/483; 364/557; 364/551.01; 361/687; 361/690; 361/694; 361/695; 395/200.54

[58] Field of Search ...................... 364/557, 505, 364/506, 481, 483, 551.01; 236/49.3, 35; 361/694, 695, 687, 690; 165/244, 247; 340/825.06, 825.22; 395/200.54

[56] References Cited

U.S. PATENT DOCUMENTS

| | | | |
|---|---|---|---|
| 3,872,842 | 3/1975 | Medley | 123/41.12 |
| 4,124,001 | 11/1978 | Samuel et al. | 236/35 |
| 4,756,473 | 7/1988 | Takemae et al. | 361/697 |
| 4,809,516 | 3/1989 | Jones | 165/236 |
| 4,916,642 | 4/1990 | Kaiser et al. | 364/550 |
| 5,102,040 | 4/1992 | Harvey | 361/695 |
| 5,235,812 | 8/1993 | Klaass et al. | 60/727 |
| 5,491,610 | 2/1996 | Mok et al. | 361/695 |
| 5,528,229 | 6/1996 | Mehta | 340/825.06 |
| 5,627,527 | 5/1997 | Mehta | 340/825.06 |
| 5,631,852 | 5/1997 | Chen | 364/557 |
| 5,653,386 | 8/1997 | Hennessee et al. | 237/12.3 B |

*Primary Examiner*—Emanuel T. Voeltz
*Assistant Examiner*—Cuong H. Nguyen
*Attorney, Agent, or Firm*—Michael J. McGowan; Robert W. Gauthier; Prithvi C. Lall

[57] ABSTRACT

A method for monitoring various parameters for equipment at network sites. A controller at each site monitors cooling fan output, ambient temperature and an electrical load. The controller includes a network interface and microcontroller for responding to requests for the values of monitored parameters. In response to such a request, the controller processes a procedure that retrieves a requested monitored parameter value and that transfers that value onto the network.

8 Claims, 5 Drawing Sheets

METHOD FOR MONITORING ENVIRONMENTAL PARAMETERS AT NETWORK SITES

STATEMENT OF GOVERNMENT INTEREST

The invention described herein may be manufactured and used by or for the Government of the United States of America for governmental purposes without the payment of any royalties thereon or therefor.

CROSS-REFERENCE TO RELATED PATENT APPLICATIONS

This patent application is co-pending with related patent applications entitled Method for Optimizing the Rotational Speed of Cooling Fans (Navy Case No. 77438); Apparatus for Monitoring Environmental Parameters At Network Sites (Navy Case No. 77501); and Apparatus for Optimizing The Rotational Speed Of Cooling Fans (Navy Case No. 77502), by the same inventor as this application.

BACKGROUND OF THE INVENTION (1) Field of the Invention

This invention is generally directed to determining the status of a network and more particularly to a method for enabling the determination of various environmental and operating parameters at different nodes on a network.

(2) Description of the Prior Art

Networks incorporate personal computers, workstations and other electronic systems that form network nodes. These systems typically utilize internal power supplies to deliver power to components and peripherals disposed within the systems. In a computer environment, peripheral devices are added using expansion slots. As more peripheral devices or other components are added, the internal power supply must deliver more current with a concomitant increase in heat being dissipated. Consequently the cooling requirements increase.

Forced convection cooling is the most widely used method for dissipating heat in such electronic systems. With forced convection cooling, fans direct air across the surface of electronic components typically inside a chassis. Some forced convection cooling system fans operate on alternating current (AC). Generally, rotational speed of AC fans cannot be easily changed. Consequently, AC fans rotate at a fixed speed that is determined by the maximum power requirement. If the power requirement reduces, the fan speed remains constant and therefore is excessive for these less demanding operating conditions. This excessive speed results in unnecessarily high levels of airborne noise caused by airflow through filters and over components, and structureborne noise caused by mechanical vibrations of the fans during operation. Excessive noise, as is known, can be disadvantageous in a number of applications.

Brushless direct current (DC) fans are becoming popular. They are reliable and are as capable as standard AC fans in cooling electronic components. The speed and resulting airflow of DC fans is proportional to the DC voltage applied. The ability to match fan speed to cooling requirements at any given time would lead to the possibility of reducing fan speed if the power supply were not operating at its maximum. Reducing fan speed by 20% produces a 5 db sound level decrease; a 40% reduction in fan speed produces a 10 db reduction in noise due to airflow and structureborne noise. There are several examples of control systems that control fan speed in response to operating parameters.

In U.S. Pat. No. 3,230,293 (1966) to Turgeon a current transformer monitors the load on a phase conductor in a multiphase electrical system. The output from the current transformer then serves to control an air foil fan that directs a cooling medium over the conductor. Thus in this reference, fan speed is dependent only upon the electrical load.

U.S. Pat. No. 5,436,827 (1995) to Gunn et al. discloses an alternative approach whereby the control boards in a power mixing circuit sense the speed of a fan and select one or the other of control boards for energizing the system. This provides parallel energizing circuits for the fan and prevents the inadvertent deenergization of the fan. The control in this patent is dependent upon fan speed as the loss of fan speed while powered by one control board will cause a shift to the other control board.

U.S. Pat. No. 5,484,012 (1996) to Hiratsuka discloses an electronic system with two fans. The electronic apparatus to be cooled is located in a housing and includes at least one heat source. The housing has an intake port and an exhaust port. The electronic apparatus comprises a cooling fan mounted in the exhaust port and an auxiliary cooling fan placed near the heat source. A first control portion controls fan speed in accordance with the temperature of intake air. A second control portion determines fan speed for the auxiliary cooling fan in a first mode when the fan speed of the cooling fan is less than a reference speed and in a second mode when the fan speed of the cooling fan is greater than the reference speed. Thus this patent discloses a control system in which fan speed is dependent upon the ambient temperature as represented by the temperature of the incoming air. This system does not provide for electrical load monitoring.

Still other patents disclose other systems for maintaining operating temperatures for electronic circuits. U.S. Pat. No. 4,685,303 (1987) to Branc et al. discloses a disk drive isolation system in which a thermo-electric heat pump maintains conditions within a disk drive in response to humidity. U.S. Pat. No. 5,121,291 (1992) to Cope et al. discloses a system in which internal temperature controls fan speed. U.S. Pat. No. 5,249,741 (1993) to Bistline describes a system that establishes fan speed based upon a particular configuration of equipment monitored during a computer operation start-up or "boot" operation. This system does not automatically adjust fan speed when an unknown device is installed.

Each of the foregoing references disclose systems for controlling fan speed. However, none of them disclose a system that is readily adapted for enabling a network manager to monitor status, such as the level of electronic load, ambient temperature and fan operation at each network node from another network node, particularly where that node might be remote from network nodes of interest. In some situations it might even be desirable to obtain such status by establishing a modem link between the network and a remote site.

More specifically, in recent years, as digital computers and the associated system have become more sophisticated, an individual at each node has less interest in monitoring environmentally related parameters. The responsibility for such monitoring parameters and responding to various malfunctions is becoming the responsibility of the network manager. Moreover, as networks become more complex and widespread, it becomes important from an operational standpoint to enhance network power and environmental management from any node on a network. Yet no such capability exists particularly in the form of a network addressable unit.

SUMMARY OF THE INVENTION

Therefore it is an object of this invention to enable a network manager to monitor the environmental status of individual network nodes.

Another object of this invention is to enable a network manager to monitor the operation of cooling fans to determine whether they are operating at a state that minimizes the noise introduced by the operation.

Another object of this invention is to enable a network manager to monitor environmentally related ambient temperature, electrical load and fan speed parameters.

In accordance with one aspect of this invention, parameters such as electrical load, ambient temperature and the rate of airflow are measured at a first digital computer attached to a network. The airflow rate is controlled in response to the monitored parameters and the parameters are save periodically. A connection exists to enable a network request to be received and to transfer the values of corresponding operating parameters back to the requesting node on the network.

In accordance with another aspect of this invention, it is possible to transfer operating parameters from a digital computer system in response to a request received over a network wherein the digital computer includes a cooling fan that directs cooling air past the electrical device that has a variable electrical load energized by a switching power supply and that operates in an environment with a variable ambient temperature. A controller associated with the digital computer monitors the power being coupled from the switching power supply to the electric load as a first parameter, ambient temperature as a second parameter and fan speed as a third parameter. The controller generates a fan speed control signal in response to the monitoring of the power ambient temperature and fan speed. In addition, the controller transfers, in response to a received operating parameter request, the value of at least one of the monitored parameters.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF THE PREFERRED EMBODIMENT

Figure 1:
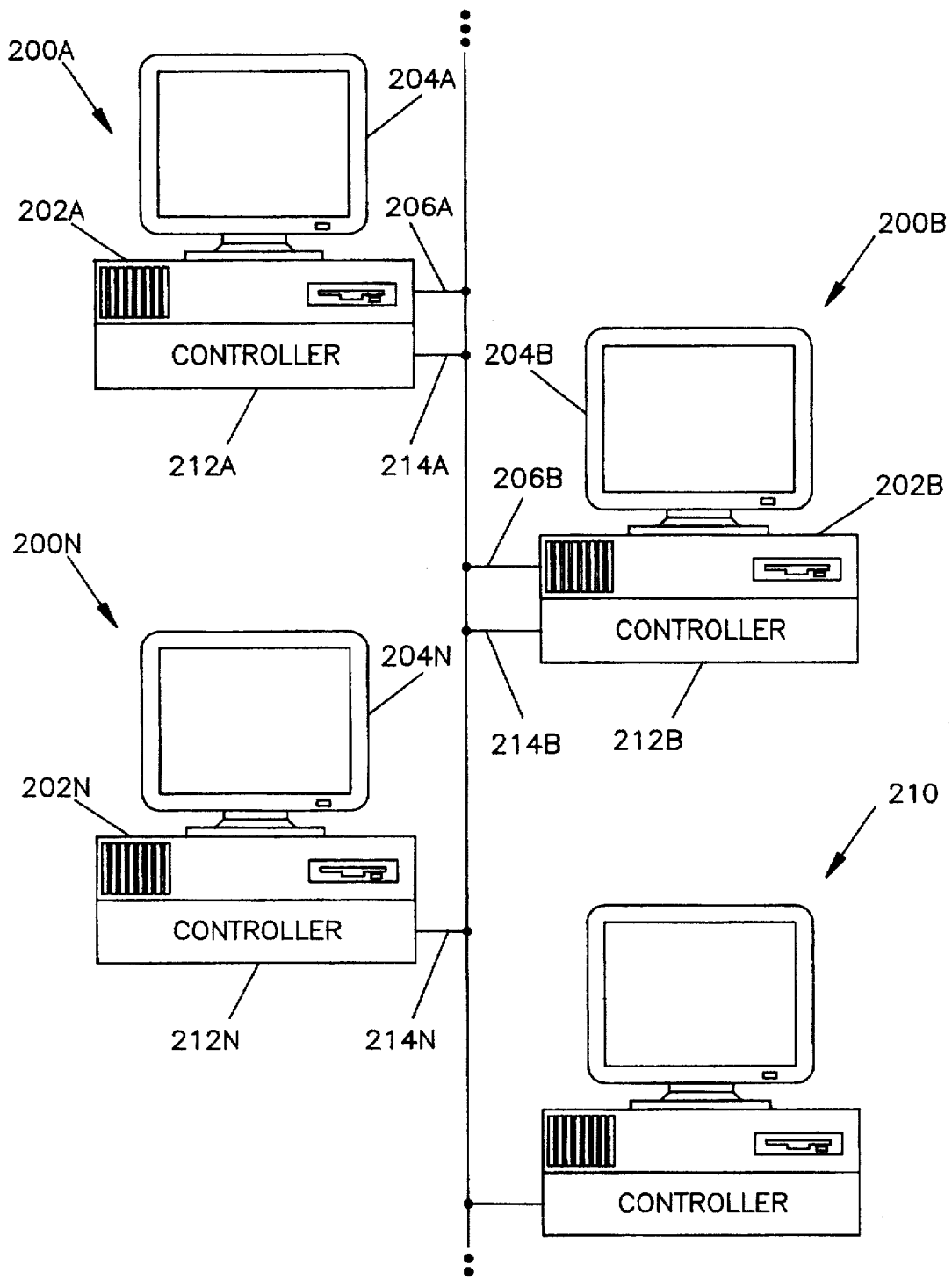
FIG. 1 is a block diagram of a network incorporating this invention.

FIG. 1 depicts a network that includes network sites 200A, 200B ... 200N. Each of these sites generally comprises a digital computer system, such as a system represented by digital computer 202A and display device 204A at the network site 200A. In this particular network the computers 202A and 202B are network nodes by virtue of connections 206A and 206B, respectively, to a network represented by a connection or path 208. In this particular embodiment the digital computer 202N at site 200N does not connect to the network.

FIG. 1 also depicts another network site 210 that represents a network administration site. This could be a remote site directly connected to the network path 208. In the alternative, the node 210 could comprise a modem connection to a geographically remote system. Such connections are well known in the art.

Each of the network sites 200A, 200B ... 200N includes a controller 212A, 212B ... 212N respectively. Each of these controllers includes a connection 214A, 214B ... 214N to the path 208 and constitutes a separate and unique address or node in the network. Network topologies such as these are well known in the art and it is sufficient to merely indicate that for this architecture a network manager at the administration system 210 can address and transfer messages with the computers 200A and 200B and, independently, the controllers 212A, 212B ... 212N. Looking at the site 200N, it will now be apparent that while it may be desired to isolate the digital computer from the network, such a system can still be monitored from the network through the controller 212N.

Figure 2:
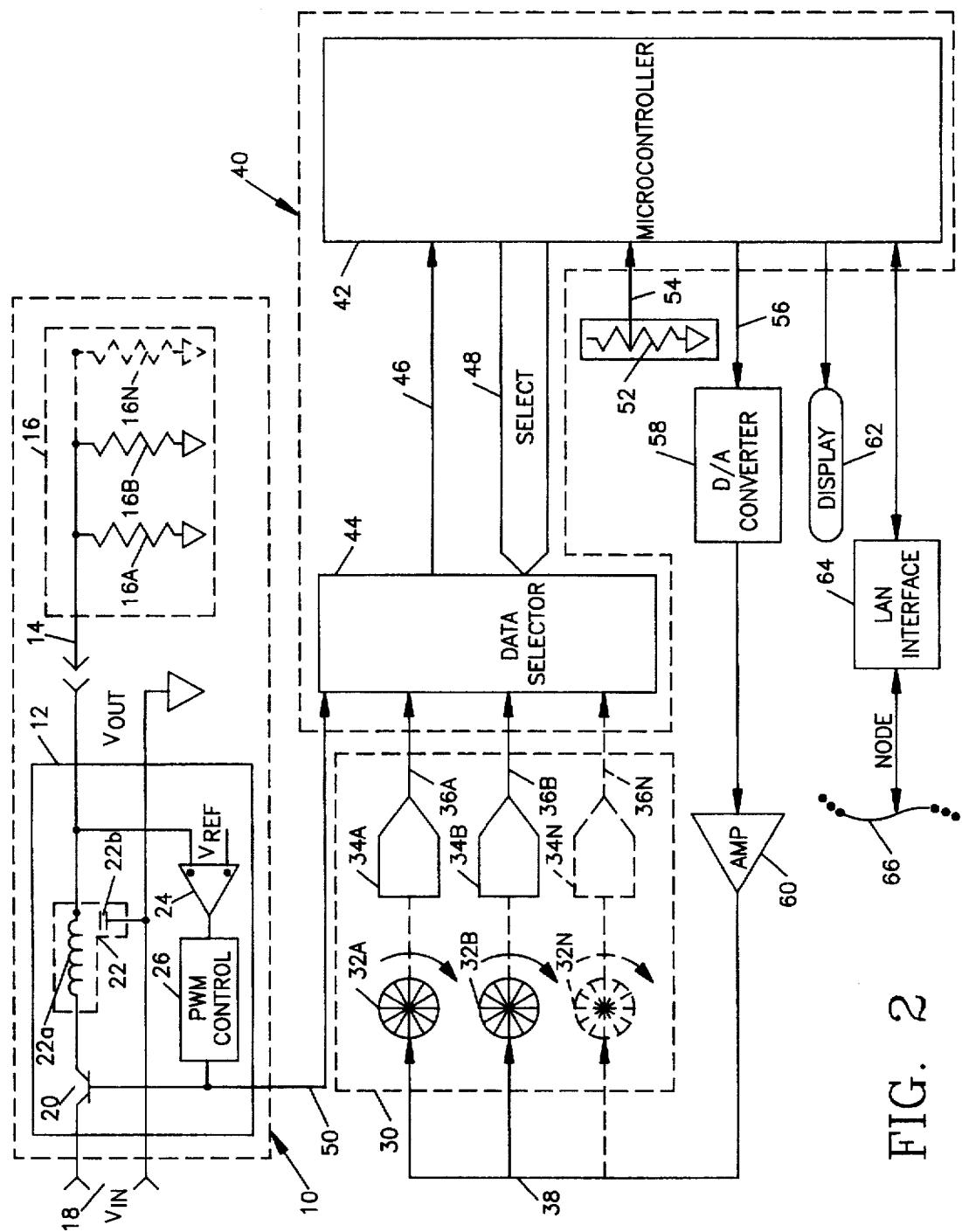
FIG. 2 is a block diagram of an electrical device with a cooling system constructed in accordance with this invention.

FIG. 2 depicts a digital system 10, such as constituted by any of the network nodes 200A, 200B ... 200N. The system 10 includes, as basic operating elements, a switching DC power supply 12 and an output conductor 14 to a variable electrical load device 16. The variable electrical load device is represented by a plurality of fixed and variable resistors 16A ... 16N representing constant and variable loads. In a digital computer environment each of the resistors 16A through 16N could be constituted by individual circuit cards that are constant or variable loads and are located within a chassis also represented as variable electrical load device 16. It can be seen that the device 16 also identifies the total electrical load of the power supply 12. In the following discussion the numeral 16 refers to the variable or total electrical load, the chassis of the digital computer or the digital computer itself, as the context dictates.

During operation, the switching power supply 12 connects to an external power source that provides a DC voltage $V_{IN}$ at a connection 18. A switching transistor 20 produces current pulses that an LC filter 22 smooths for transfer over the output conductor 14 to the electrical load 16 as a $V_{OUT}$ signal. A comparator 24 generates an error signal in response to the output signal ($V_{OUT}$) and a reference signal $V_{REF}$ corresponding to the desired output voltage. A pulse-width modulated (PWM) control unit 26 converts the error signal into a PWM control signal that establishes the duty cycle for the operation of the switching transistor 20, as known in the art. Typically the PWM control unit 26 will vary the duty cycle of the control signal between minimum and maximum values that correspond to the minimum and maximum expected loads.

Stated differently, the DC output voltage, $V_{OUT}$, for the switching power supply 12 is proportional to the input unregulated voltage, $V_{IN}$, and the ratio of the "ON" time, $T_{ON}$, to the total time period T of the signal from PWM control unit 26. This relationship can be expressed mathematically as:

$$V_{OUT} = V_{IN}(T_{ON}/T)$$

As the transistor switches from "ON" to "OFF", the periodicity of the current waveform is identical to the $T_{ON}/T$ period of the PWM signal. This current is fed to a series inductor 22a and shunt capacitor 22b and supplies the output load, such as the computer 16. As the output load current changes with variable loads, the input current changes in a like manner, and the DC or average value of the current flowing into the inductor 22a of the LC filter 22 equals the output load current. This average value is a function of the $T_{ON}/T$ ratio established by the PWM control circuit. Hence, if the $T_{ON}/T$ ratio, i.e., the duty cycle, of the signal from the PWM control unit 26, is measured, the average value of DC load current can also be accurately computed. Consequently, the switching power supply 12 and electrical load 16 shown in FIG. 2 constitute a variable load energized by a power supply in response to a load control signal generated by the PWM control unit 26.

Forced convection cooling maintains the electrical load within appropriate operating temperature limits by directing ambient air as a cooling medium past the electrical load elements. A fan assembly 30 provides this air and may comprise one or more variable speed fans generally mounted on the chassis 16. In the particular system 10 of FIG. 2 the fan assembly 30 includes a plurality of variable-speed fans 32A, 32B ... 32N. A plurality of tachometers 34A, 34B ... 34N provide signals on conductors 36A, 36B ... 36N representing the speeds of the respective fans. Each tachometer may be added to or integral with a corresponding fan.

In this particular embodiment the fans are connected electronically in parallel, so that the voltage applied to a common input conductor 38 controls the fan speed. Typically increasing the voltage will increase fan speed. Consequently the voltage on the input conductor 38 will vary between minimum and maximum values that correspond to the minimum and maximum fan speeds for adequate cooling at minimum and maximum load conditions respectively. The capacity and speed range of each fan will determine the number of fans required for a given range of load conditions.

In accordance with one aspect of this invention, a system 40 for monitoring various operating parameters and controlling the fan speed includes, as its basic elements, a microcontroller 42, a data selector 44 with a data bus 46 to the microcontroller 42. The data selector 44 responds to signals on a SELECT bus 48 by conveying data from one of several sources, namely the PWM control unit 26 and the tachometers 34A, 34B ... 34N. Specifically, the PWM control signal transfers to the data selector over a transfer conductor 50 thereby enabling the control system 40 to monitor the load of the electrical device. Signals from the tachometers 34A, 34B ... 34N enable the control system 40 to monitor fan speed that indicates the airflow past the electrical device.

The microcontroller 42 also monitors the ambient temperature by means of a thermistor 52 coupled to the microcontroller 42 by a thermistor conductor 54. In one embodiment, as described in more detail later, the thermistor 52 produces an analog signal that the microcontroller 42 converts into a digital form. A thermistor that provides digital signals could also be used.

The microcontroller 42 uses these monitored conditions to establish a fan speed set point signal that establishes the voltage on the input conductor 38. In this particular embodiment the fan speed set point signal appears on converter conductor 56. A D/A converter 58 produces an analog output signal that an amplifier 60 uses to provide the necessary voltage and power to the fans 32A, 32B ... 32N.

FIG. 2 also depicts a display 62 that can provide a display representative of the load and rotational speed of the fans. A Local Area Network (LAN) interface 64, typically an Ethernet Interface or Fiber Distributed Data Interface (FDDI), provides a means for connecting the control system to a network 66 in parallel with any digital computer. This interface 64 enables the microcontroller 42 to provide status information onto the network 66 in response to a request from any site on the network. The operation of the microcontroller in response to network requests is described later.

Figure 3:
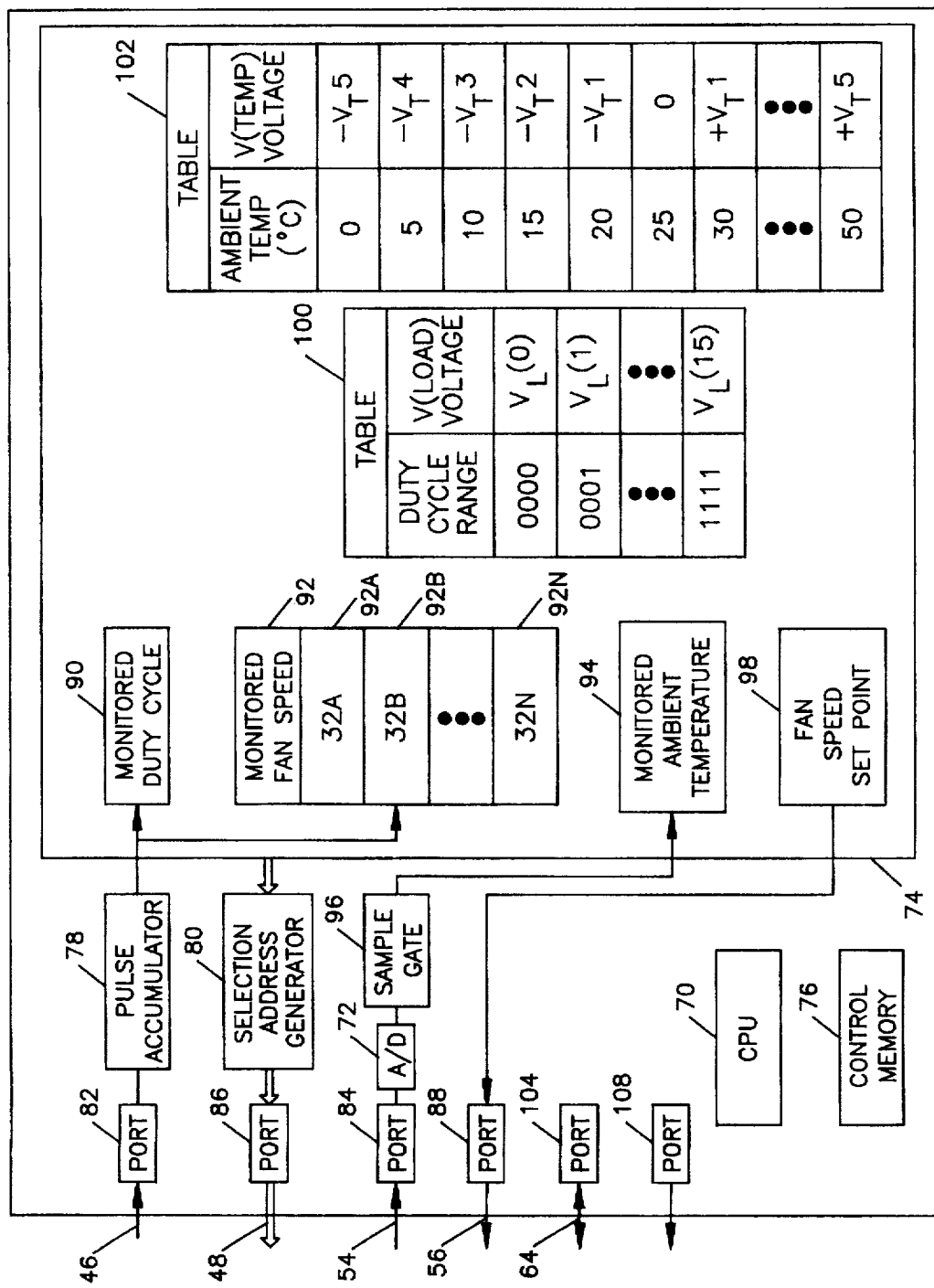
FIG. 3 depicts the internal construction of a controller shown in FIG. 1.

FIG. 3 depicts the various functions and organization of the microcontroller 42 that can be implemented with any number of devices. One such device is a Motorola MC68HC11 microcontroller. Such a microcontroller contains a central processing unit (CPU) 70, an analog-to-digital (A/D) converter 72, a random access memory (RAM) 74 and a control memory 76 for establishing particular procedures. The control memory 76 typically will be constituted by an electrically erasable programmable memory (EEPROM). This particular microcontroller also includes a pulse accumulator 78 and a selection address generator 80 for producing the SELECT signals on the SELECT bus 48. Integral input port 82 receives the selected one of the PWM control signals and the tachometer signals on data bus 46; thermistor input port 84 receives the ambient temperature signal on thermistor conductor 54. SELECT output port 86 transfers SELECT signals onto the SELECT bus 48; signal output port 88 transfers the fan speed set point signal onto converter conductor 56.

The memory 74 comprises a number of buffers and tables that are useful in controlling fan speed. These include a monitored duty cycle buffer 90 for receiving a value indicative of the duty cycle of the PWM control signal from the control unit 26 from FIG. 2 in digital format. In a typical application the particular duty cycle value could be encoded into a four-bit word that, in turn, would effectively divide the duty cycles in sixteen duty cycle ranges.

A monitored fan speed buffer 92 includes locations 92A, 92B ... 92N for storing the fan speeds for fans 32A, 32B ... 32N respectively generated by a corresponding one of the tachometers 34A, 34B ... 34N. These would also be provided from the pulse accumulator 78. As will be apparent, each of the values stored in the buffers 90 and 92 will require some processing to convert the data in the pulse accumulator 78 into an appropriate value.

A monitored ambient temperature buffer 94 receives the output from the A/D converter 72 through some type of sample gate 96. The buffer 94 contains a value that represents the ambient temperature as recorded by the thermistor 52 in FIG. 2.

A fan speed set point buffer 98 receives the fan speed set point in digital form. This signal is coupled through the signal output port 88 onto the converter conductor 56 for controlling the energy level of the fans.

The memory 74 additionally contains two tables. Table 100 includes at successive addresses therein values designated as V(LOAD) voltages. The monitored duty cycle contained in the buffer 90 can be used as an index into the table 100 thereby to select a voltage value. Assuming that the load is converted into a four-bit load value, the resulting ranges from 0000 to 1111 can define sixteen V(LOAD) voltages designated as $V_L(0)$ to $V_L(15)$.

Table 102 correlates ambient temperature (typically in ° C.) into a set of values or V(TEMP) voltages. As shown in FIG. 3, table 102 includes locations having an address corresponding to 25° C. that is a desired operating temperature for the equipment. The V(TEMP) voltage value for this temperature is 0. For lower ambient temperatures (i.e., from 20° C. to 0° C.) the V(TEMP) voltage values will be negative because the cooling effect of the ambient air will be greater. The cooler the air, the less airflow is needed, so the fan speed can be reduced. Conversely as the ambient temperature increases above 25° C., additional fan speed is required. The increments above 25° C. have increasing positive values.

The control memory 76 may contain instructions for a plurality of procedures including a control procedure. The control procedure operates essentially continuously and iteratively, unless interrupted, as known in the art. LAN port 104 enables a connection with the LAN interface 64 in FIG. 2 and a response to messages received from the network. Display port 108 serves as an output port to the display 62 in FIG. 2.

The control procedure contained in the control memory 76 operates, after initialization, in an iterative loop. Essentially it uses the entries into the tables 100 and 102 during each iteration to establish an updated fan speed set point. More particularly, and referring to FIG. 4, when power is applied to the system 10 in FIG. 2, step 110 initiates the procedure. In step 112 the fan speed set point in buffer 98 is set to a maximum value, i.e., the voltage from the amplifier 60 in FIG. 2 is at a maximum. This may be a preset value or may be the sum of the maximum values in the tables 100 and 102. That is, the initial fan speed set point could be based on the sum of the V(LOAD) and V(TEMP) voltage values. This assures maximum cooling on start-up and until a positive determination of the actual operating conditions can be made.

Steps 114, 116 and 118 then define a control loop that monitors the outputs from the tachometers 34A . . . 34N. The delay in step 114 allows the fans to reach maximum speed. Step 116 retrieves the fan speed signals from tachometers 34A . . . 34N in FIG. 2 and transfers the corresponding information into the fan speed buffer 92 in FIG. 3. In step 118, the fan speeds in buffer 92 in FIG. 3 are compared to the maximum fan speed. When the fans reach maximum speed, control diverts from step 118 to step 120 where the microcontroller 42 reads the PWM signal from the PWM control unit 26 through the port 82 and the pulse accumulator 78 of FIG. 3, processes that information and transfers and saves the corresponding digital representation of the duty cycle range and hence the load range into the monitored duty cycle buffer 90. In step 122 the microcontroller 42 uses the table 100 to obtain the corresponding V(LOAD) voltage values.

In step 124 the microcontroller 42 reads the thermistor 52 of FIG. 2 through the port 84, A/D converter 72 and sample gate 96. After the microcontroller processes the resulting signal it saves the ambient temperature in digital form in the monitored ambient temperature buffer 94. In step 126 the microcontroller uses table 102 to retrieve the corresponding V(TEMP) voltage value.

In step 128 the microcontroller 42 sums the V(LOAD) and V(TEMP) voltage values to produce an updated set point signal. After a delay, defined by step 130 to assure a stable control function, the microcontroller 42 retrieves the fan speed signals from the tachometers 34A . . . 34N in FIG. 2 to be saved individually in the monitored fan speed buffer 92. Step 134 determines whether the measured fan speed equals the fan speed obtained in step 128. If the fan speed does not correspond to that updated set point, step 136 replaces the contents of the fan speed set point buffer 98 with the sum obtained in step 128 plus some increment to adjust for particular atmospheric or wear problems. Steps 130, 132 and 134 continue the loop until the fan speed reaches the correct value. When the fan speed reaches a value corresponding to the updated set point value or if it is already at that value, step 134 branches back to step 120 to begin another iteration of the control procedure in the control memory 76.

Referring again to FIG. 1, protocols for communicating over various networks are well known. The construction of the microcontroller 42 in FIGS. 2 and 3 facilitates the ability of a network manager to determine the status at any one of the network nodes 200A, 200B . . . 200N. Known protocols may operate with or without security. Security can be provided for limiting access to a particular network manager and, as previously indicated, the network manager could gain access from the network node 210 or through any of the other network nodes that were properly configured.

In a simple system, the network manager can request any one of several operating parameters based upon information in each of the controllers 212A, 212B . . . 212N. Each controller would have an independent network address as previously indicated and the network manager, upon formulating a request, would send a request through a network interface card. That request would contain, among other information, the address of a particular controller to be monitored and a command requesting a monitored status. In this particular example it will be assumed that a separate command exists for requesting the status of each parameter.

Figure 5:
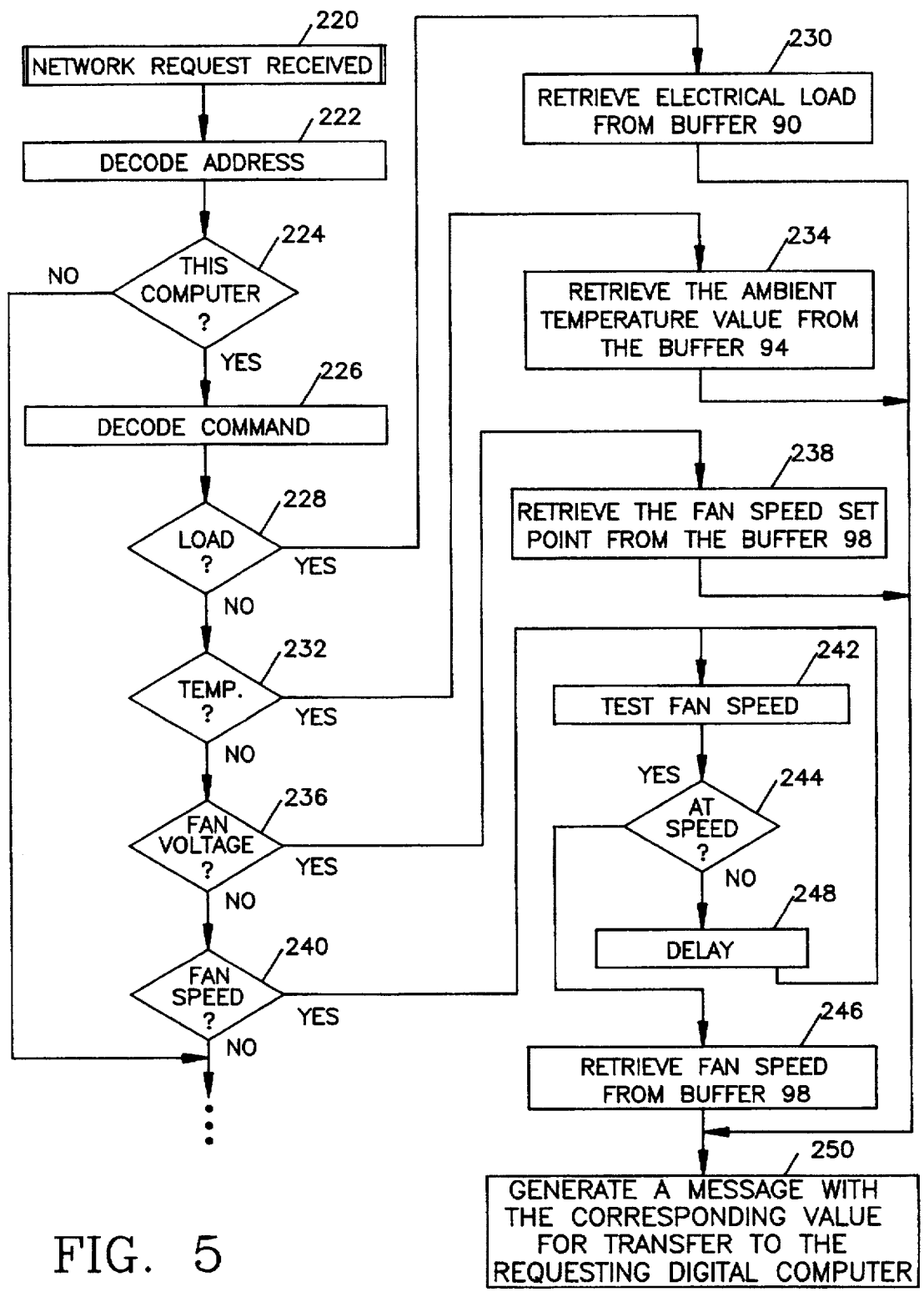
FIG. 5 is a flow chart depicting the operation of a network node shown in FIG. 1.

FIG. 5 depicts a procedure whereby a request from a network manager operates by transferring to the digital computer of the network manager an operating parameter. During this procedure codes are detected sequentially and each request only produces one code. As will be apparent, it is also possible to establish a request that would define at least one or more or all of the operating parameters. In such a situation appropriate changes would be made to the procedure set forth in FIG. 5. The procedure begins at step 220 when the microcontroller receives a request from the network transferred from the port 104 and the LAN interface 64 shown in FIG. 3 and FIG. 2, respectively. In response the procedure decodes the address of the request at step 222 to determine whether the request is for the corresponding network node as represented by the related computer. If it is, step 224 diverts to step 226 where the microcontroller 42 in FIG. 3 retrieves the command portion for decoding.

The next sequence of steps decodes individual commands. For example, if the request is a request for the electrical load at the network node, step 228 diverts to step 230 to retrieve the saved electrical load value from the buffer 90 in FIG. 3. If the request is for the ambient temperature, steps 228 and 232 shift the procedure to step 234 to retrieve the ambient temperature value from the buffer 94 in FIG. 3. For a fan voltage, steps 228 and 232 transfer control to step 236. In turn step 236 shifts control to step 238 to retrieve the fan speed set point from the buffer 98 in FIG. 3.

If the command is for fan speed, steps 228, 232 and 236 divert to step 240. The procedure of FIG. 5 tests the fan speed at step 242 and determines whether the fan is running at speed in step 244. If it is, the system uses step 246 to retrieve the fan speed from the buffer 98 in FIG. 3. Otherwise step 244 diverts to step 248 to interpose a delay before testing the fan speed again in step 242.

Once any of the commands is decoded and the corresponding steps, such as steps 234, 238 and 246, obtain a corresponding value, control shifts to step 250. Step 250 generates a message with the corresponding value for transfer back to the requesting network node. Thus, a network manager can obtain the value of any of the foregoing operating parameters from any site in the network.

If, however, the address is not for the computer 224 or the command is not one of the foregoing commands, steps 224 and steps 240 will transfer control to some other procedure that might be constituted by an error or other procedure.

Figure 4:
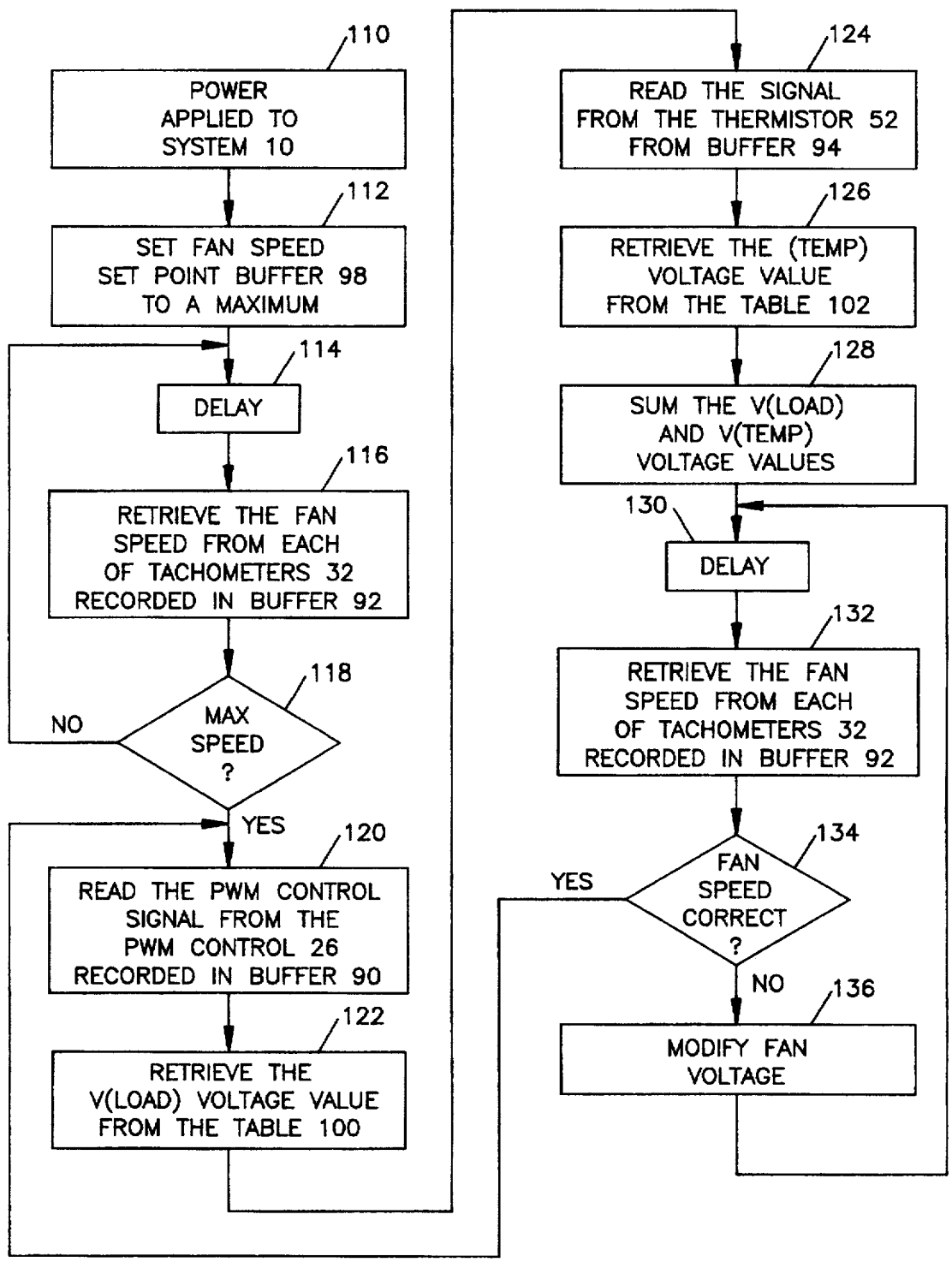
FIG. 4 is a flow chart depicting the operation of the system shown in FIG 2 and controller shown in FIG. 3.

Therefore in accordance with this invention the circuitry in FIGS. 2 and 3 operate in accordance with the procedures of FIG. 4 to provide a method and apparatus for controlling fan speed. In addition they provide an apparatus and method for monitoring the various operating parameters for each digital computer such as electrical load, ambient temperature and fan speed. By interposing a LAN interface, such as the LAN interface 64 in FIG. 2, between the microcontroller 42 shown in FIG. 3 and the network, it is possible to expand the capabilities of the circuitry shown in FIGS. 2 and 3 by allowing a network manager to retrieve those parameters essentially independently of the operation of any attached data processing system at a particular network site. This enables the network manager to make decisions concerning the administration of the system and to analyze the system for potential failures as might be recorded by for example retrieving fan speeds from parallel fans at a single network node and noting wide diversity in those speeds. Consequently this invention allows the network manager to take over significant responsibilities concerning the monitoring of environmental conditions related to each network node and the equipment attached thereto.

This invention has been disclosed in terms of certain embodiments. It will be apparent that many modifications can be made to the disclosed apparatus without departing from the invention. For example, the substitution of a request that could obtain the total operating status for all monitored computer operating parameters can, as previously indicated, be substituted for the single-parameter request. Parallel decoding of commands can be substituted for the requested decoding disclosed in FIG. 5. Still other parameters might be monitored and made available. Step 118 in FIG. 4 and step 244 in FIG. 5 may incorporate an error checking sequence which will provide an indication or transfer control to steps 120 and 246, respectively, if the fans do not reach maximum speed within a sufficient time. Therefore, it is the intent of the appended claims to cover all such variations and modifications as come within the true spirit and scope of this invention.

What is claimed is:

1. A method for providing preselected operating parameters of a first digital computer connected in a network in response to a request for operating status from a second digital computer connected in the network wherein the first digital computer includes means for controlling the temperature of the digital computer by directing air having an ambient temperature through the first digital computer, said method comprising the steps of:

monitoring at least one of the electrical load of the first digital computer and the ambient temperature of and flow rate of air through the first digital computer;

adjusting the airflow past the first digital computer in response to the monitored electrical load, ambient temperature and airflow;

saving the monitored values of at least one of the electrical load, ambient temperature and airflow; and transferring the saved monitored values to the second digital computer.

2. A method as recited in claim 1 wherein the airflow is generated by at least one variable speed fan and said saving step saves a monitored fan speed value.

3. A method as recited in claim 2 wherein the electrical load is constituted by a variable load energized by a power supply in response to a load control signal and said saving step includes saving a value corresponding to the load control signal.

4. A method as recited in claim 1 wherein the electrical load is constituted by a variable load energized by a power supply in response to a load control signal and said saving step includes saving a value corresponding to the load control signal.

5. A method for transferring operating parameters of a digital computer system in response to a request received over a network wherein the digital computer system includes at least one cooling fan that directs cooling air through the digital computer system and a variable electrical load energized by a switching power supply and operated in an environment with a variable ambient temperature, said method comprising the steps of:

monitoring as a first parameter the power being coupled from the switching power supply to the electrical load;

monitoring as a second parameter the ambient temperature;

monitoring as a third parameter the speed of the at least one fan;

generating a fan speed control signal in response to the monitoring of the power, ambient temperature and fan speed; and transferring, in response to a received operating parameter request from the network the value of at least one of the monitored parameters.

6. A method as recited in claim 5 wherein the switching power supply operates in response to a pulse-width modulated control signal and said power monitoring step includes measuring the duty cycle of the pulse-width modulated control signal.

7. A method as recited in claim 5 wherein the at least one fan includes tachometer means for generating a signal indicating fan speed and said fan speed monitoring step includes measuring the tachometer signal.

8. A method as recited in claim 7 wherein the switching power supply operates in response to a pulse-width modulated control signal and said power monitoring step includes measuring the duty cycle of the pulse-width modulated control signal.

* * * * *